(12) United States Patent
Lin et al.

(10) Patent No.: US 11,967,532 B2
(45) Date of Patent: Apr. 23, 2024

(54) GATE SPACERS AND METHODS OF FORMING THE SAME IN SEMICONDUCTOR DEVICES

(71) Applicant: Taiwan Semiconductor Manufacturing Company, Ltd., Hsin-Chu (TW)

(72) Inventors: Ta-Chun Lin, Hsinchu (TW); Kuo-Hua Pan, Hsinchu (TW); Chih-Yung Lin, Hsinchu County (TW); Jhon Jhy Liaw, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 337 days.

(21) Appl. No.: 17/370,898

(22) Filed: Jul. 8, 2021

(65) Prior Publication Data

US 2022/0319931 A1    Oct. 6, 2022

Related U.S. Application Data

(60) Provisional application No. 63/168,579, filed on Mar. 31, 2021.

(51) Int. Cl.
*H01L 21/8234* (2006.01)
*H01L 29/66* (2006.01)

(52) U.S. Cl.
CPC ........... *H01L 21/823431* (2013.01); *H01L 21/823418* (2013.01); *H01L 21/823468* (2013.01); *H01L 29/6681* (2013.01)

(58) Field of Classification Search
None
See application file for complete search history.

(56) References Cited

U.S. PATENT DOCUMENTS

| | | | | |
|---|---|---|---|---|
| 2004/0157457 A1* | 8/2004 | Xu | ............. | H01L 21/32139 257/E21.235 |
| 2007/0196972 A1* | 8/2007 | Shima | ............. | H01L 21/823807 257/E21.64 |
| 2018/0151440 A1* | 5/2018 | Liao | ............. | H01L 29/0649 |
| 2019/0103475 A1* | 4/2019 | Kao | ............. | H01L 29/66553 |
| 2020/0058784 A1* | 2/2020 | Chang | ............. | H01L 21/823431 |

* cited by examiner

*Primary Examiner* — Joseph C. Nicely
*Assistant Examiner* — Lamont B Koo
(74) *Attorney, Agent, or Firm* — Haynes and Boone, LLP

(57) ABSTRACT

A method of forming a semiconductor structure includes forming a semiconductor fin over a substrate, forming a dummy gate stack over the semiconductor fin, depositing a dielectric layer over the dummy gate stack, and selectively etching the dielectric layer, such that a top portion and a bottom portion of the dielectric layer form a step profile. The method further includes removing portions of the dielectric layer to form a gate spacer and subsequently forming a source/drain feature in the semiconductor fin adjacent to the gate spacer.

20 Claims, 12 Drawing Sheets

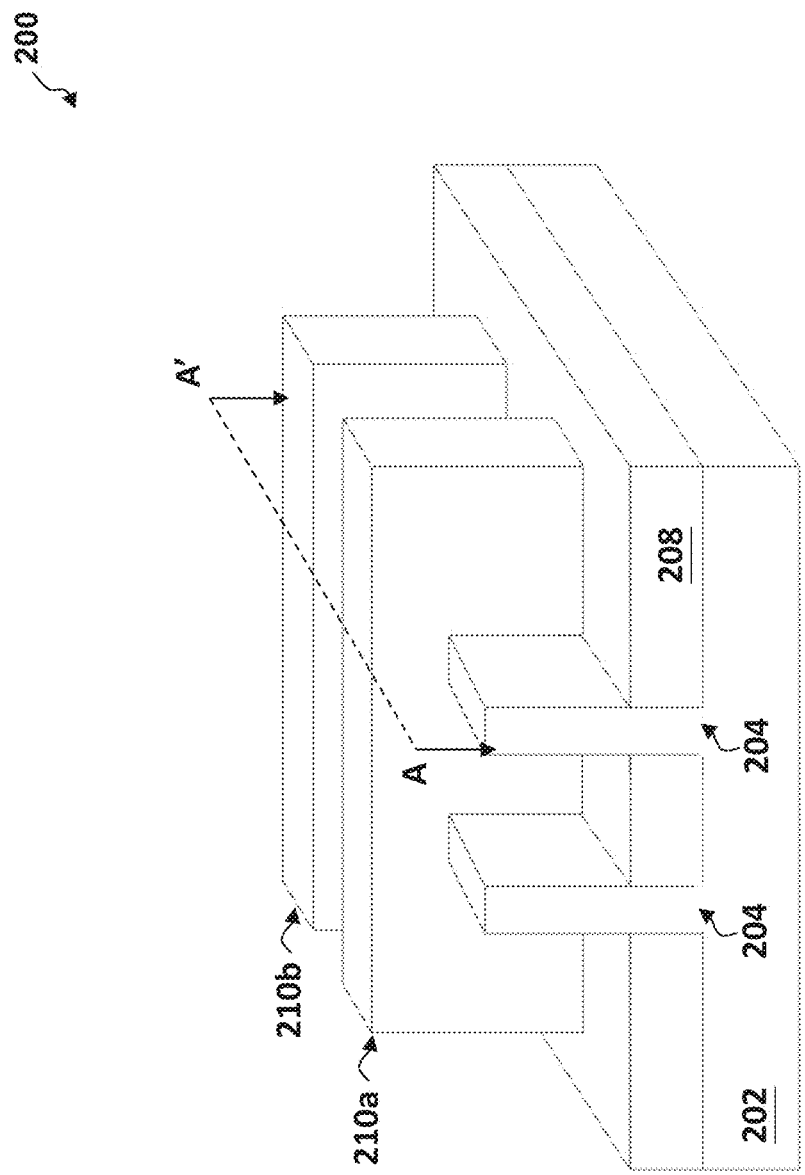
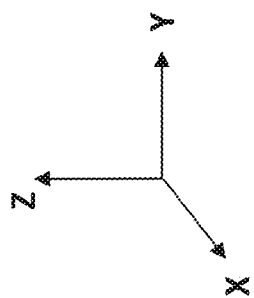
FIG. 2

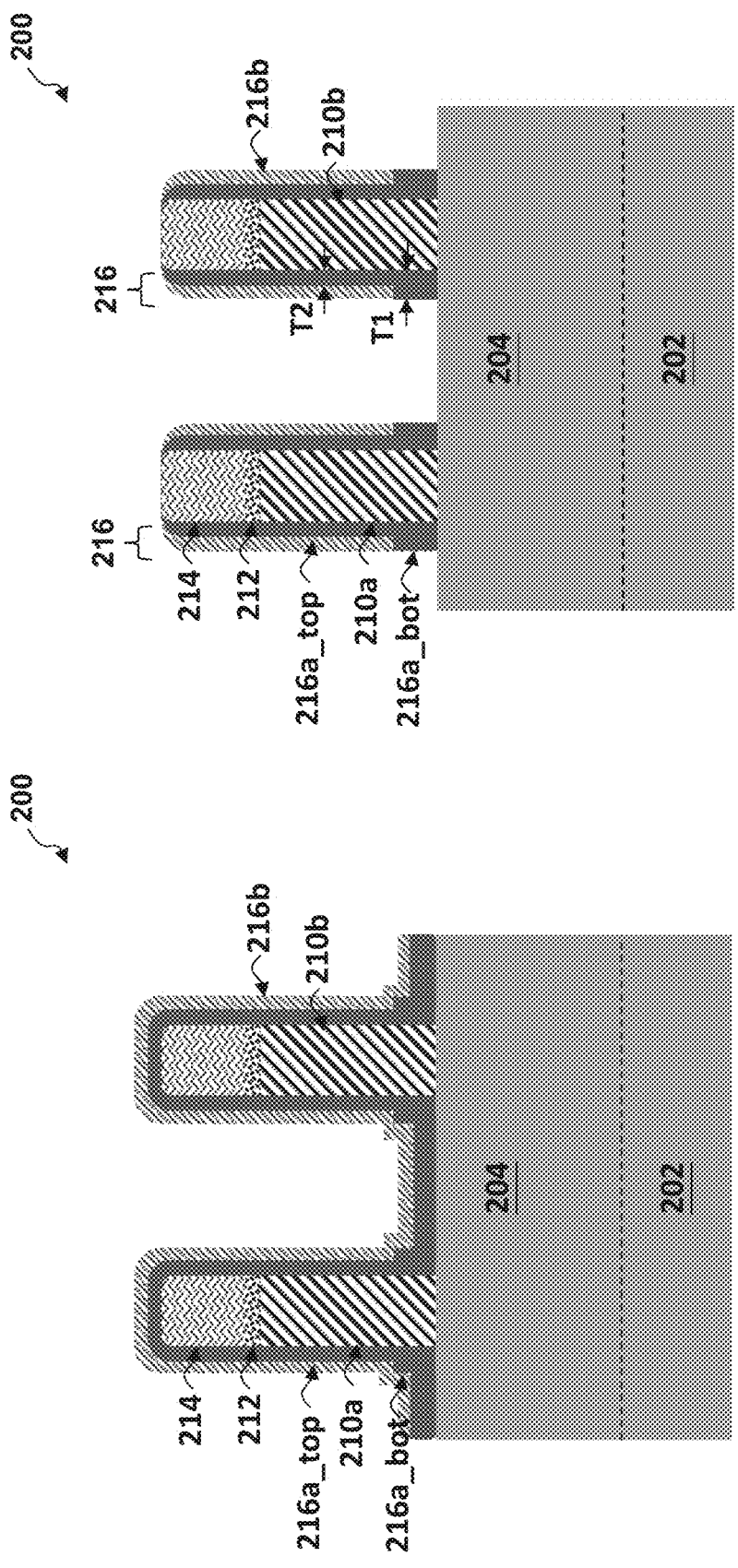

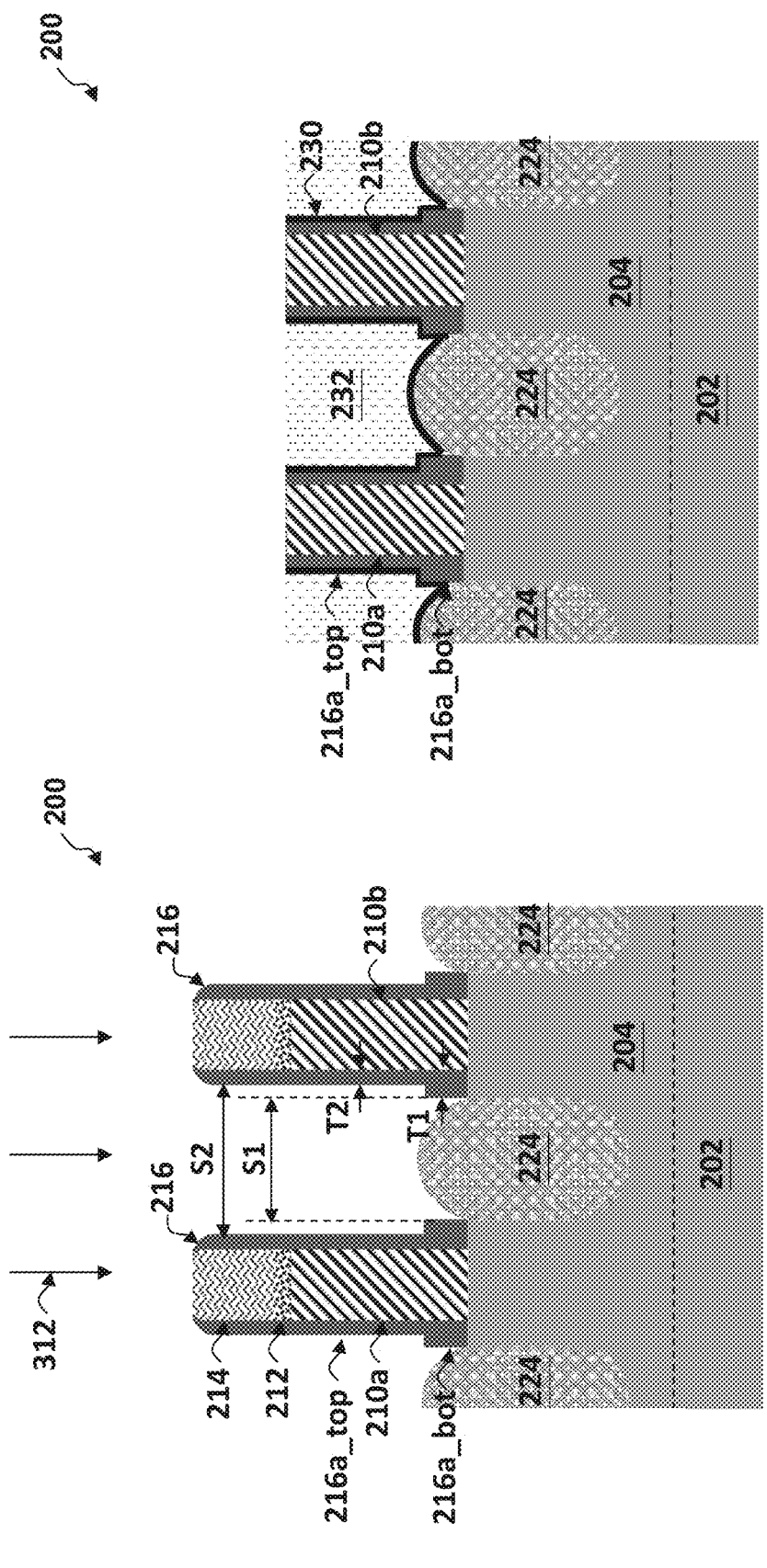

GATE SPACERS AND METHODS OF FORMING THE SAME IN SEMICONDUCTOR DEVICES

CROSS-REFERENCE TO RELATED APPLICATIONS

This application claims priority to the U.S. Provisional Application Ser. No. 63/168,579, filed Mar. 31, 2021 and titled "Gate Spacers and Methods of Forming the Same in Semiconductor Devices," the entire disclosure of which is hereby incorporated by reference.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

As integrated circuit (IC) technology continues to advance, spacings between various features are reduced to accommodate demand for higher device density. While methods of forming gate stacks and gate spacers at reduced length scales have been generally adequate, they have not been entirely satisfactory in all aspects. For example, reduced gate spacings may lead to inadvertent structural defects and compromised device performance in IC devices. Accordingly, improvements in methods of forming gate spacers at reduced length scales are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2 is a three-dimensional perspective view of an example semiconductor device according to various embodiments of the present disclosure.

FIGS. 3, 4, 5A, 5B, 6, 7, 8, 9, 10, 11, 12, 13, 14, 15, 16, and 17 are cross-sectional views of the semiconductor device taken along line AA' as shown in FIG. 2, in part or in entirety, during intermediate stages of the method shown in FIGS. 1A and/or 1B according to various embodiments of the present disclosure.

DETAILED DESCRIPTION

Figure 1A:
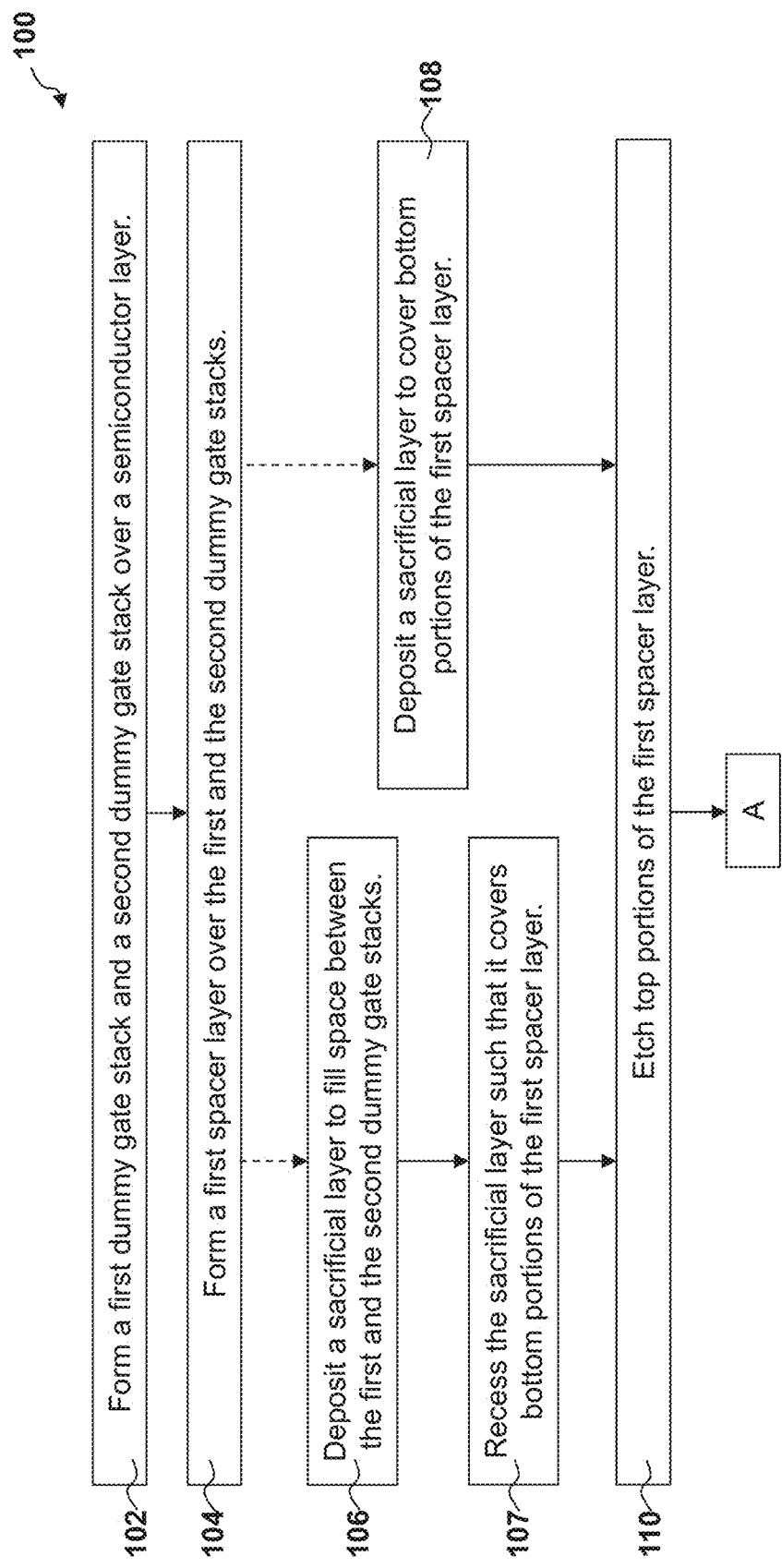
FIGS. 1A and 1B illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

Gate spacers are generally formed along sidewalls of a gate stack to insulate the gate stack from adjacent conductive features, such as a source/drain (S/D) contact features. As IC technology continues to advance, spacings between various features are reduced to accommodate demand for higher device density. While methods of forming gate stacks and gate spacers at reduced length scales have been generally adequate, they have not been entirely satisfactory in all aspects. In one example, reduced gate spacings (i.e., spacings between adjacent gate spacers) may cause under-etching of S/D recesses, resulting in altered S/D feature sizes. In another example, the reduced gate spacings may limit the removal of material during epitaxial growth of the S/D features, and the remaining excess material may lead to structural defects. In yet another example, the reduced gate spacings may limit etchants from penetrating between two gate stacks, thereby leading to under-etching of an S/D contact opening. For at least these reasons, improvements in methods of forming gate spacers at reduced length scales are desired.

Figure 1B:
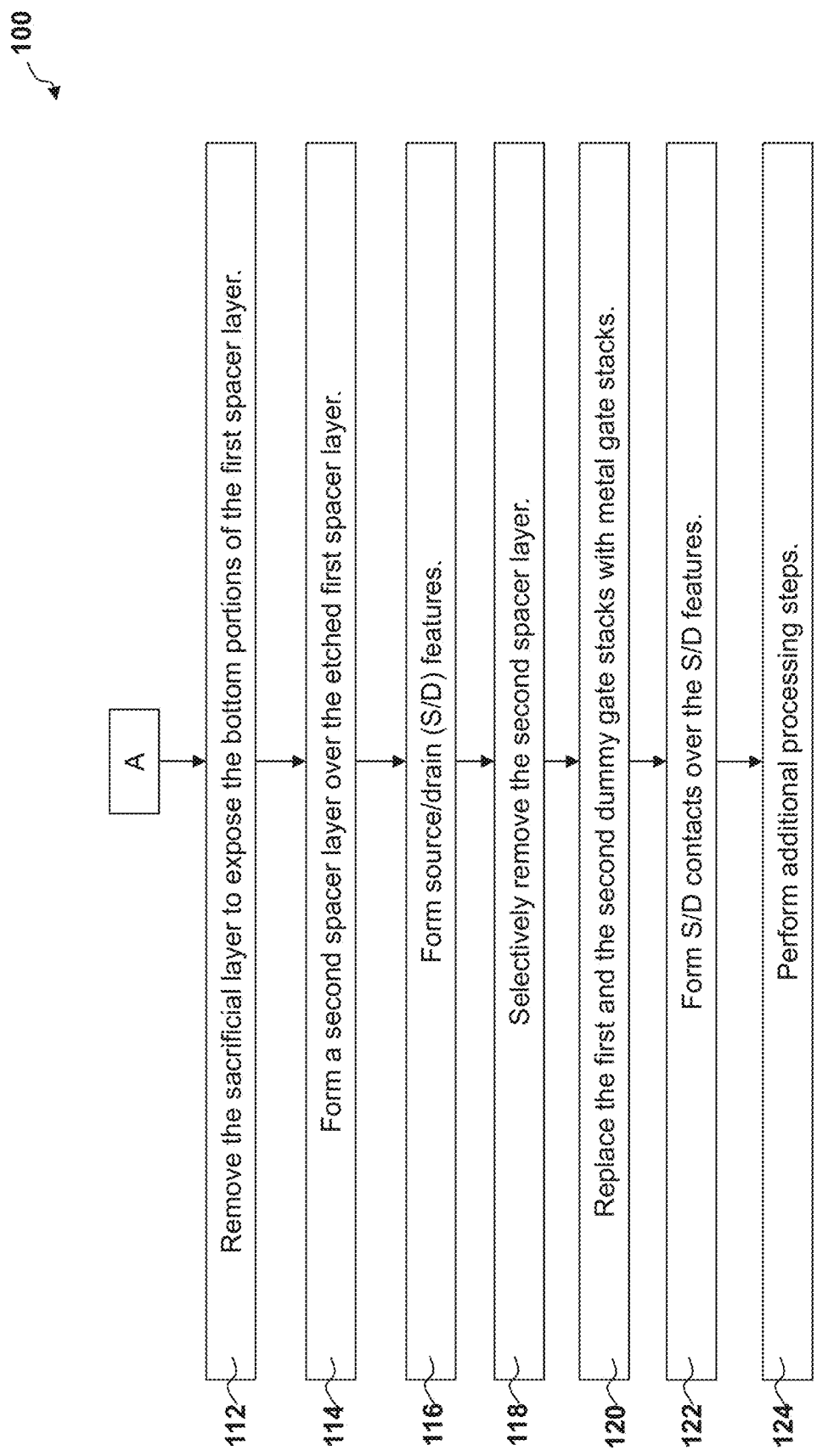

Referring now to FIGS. 1A and 1B, a method 100 of forming a semiconductor device 200 (hereafter simply referred to as the device 200) is illustrated in a flowchart according to various aspects of the present disclosure. Method 100 is merely an example and is not intended to limit the present disclosure beyond what is explicitly recited in the claims. Additional operations can be provided before, during, and after method 100, and some operations described can be replaced, eliminated, or moved around for additional embodiments of the method. Method 100 is described below in conjunction with FIGS. 2-17. In particular, FIGS. 3, 4, 5A, 5B, 6, 7, 8, 9, 10, 11, 12, 13, 14, 15, 16, and 17 are cross-sectional views of the device 200 taken along line AA' as shown in FIG. 2 at intermediate steps of method 100 according to some embodiments of the present disclosure.

The device 200 may be an intermediate device fabricated during processing of an IC structure, or a portion thereof, that may comprise static random-access memory (SRAM) devices, logic devices, I/O devices, passive components such as resistors, capacitors, and inductors, and active components such as FinFETs, nanosheet FETs (alternatively referred to as gate-all-around, or GAA, FETs), metal-oxide semiconductor field effect transistors (MOSFETs), complementary metal-oxide semiconductor (CMOS) transistors, bipolar transistors, high voltage transistors, high frequency transistors, and/or other transistors. In some embodiments, the device 200 is fabricated as an SRAM device in an IC structure that also includes a logic device, an I/O device, or a combination thereof. The present disclosure is not limited to any particular number of devices or device regions, or to any particular device configurations. For example, though the device 200 as illustrated is a three-dimensional device, the present disclosure may also provide embodiments for fabricating planar devices. Additional features can be added to the device 200, and some of the features described below can be replaced, modified, or eliminated in other embodiments of the device 200.

Figure 3:
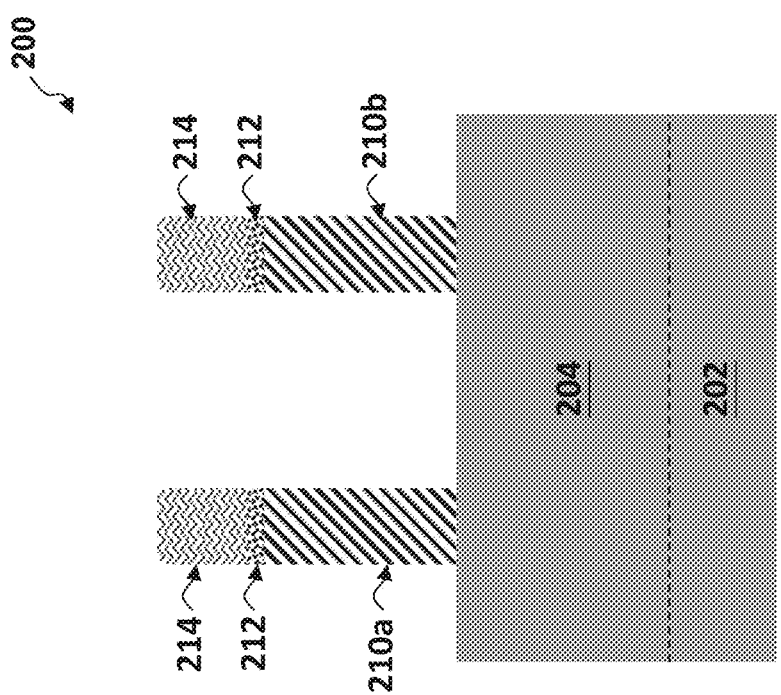

At operation 102, referring to FIGS. 1A and 2 and 3, method 100 provides a workpiece that includes at least a semiconductor substrate (hereafter referred to as the substrate) 202, fin active regions (or fins) 204 protruding from the substrate 202 and oriented along the X-axis, isolation features 208 separating bottom portions of the fins 204, and dummy gate stacks (or placeholder gates) 210a and 210b disposed over channel regions of the fins 204 and oriented along the Y-axis that is generally perpendicular to the X-axis.

The semiconductor substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The semiconductor substrate 202 may be a single-layer material having a uniform composition. Alternatively, the semiconductor substrate 202 may include multiple material layers having similar or different compositions suitable for IC device manufacturing.

In some examples where the semiconductor substrate 202 includes FETs, various doped regions may be disposed in or on the semiconductor substrate 202. The doped regions may be doped with n-type dopants, such as phosphorus or arsenic, and/or p-type dopants, such as boron or $BF_2$, depending on design requirements. The doped regions may be formed directly on the semiconductor substrate 202, in a p-well structure, in an n-well structure, in a dual-well structure, or in a raised structure. Doped regions may be formed by implantation of dopant atoms, in-situ doped epitaxial growth, and/or other suitable techniques. These examples are for illustrative purposes only and are not intended to be limiting.

The fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 protruding from the substrate 202. The etching process may include dry etching, wet etching, reactive ion etching (RIE), other suitable processes, or combinations thereof.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 204.

In some embodiments, as depicted herein, the fins 204 each include a single semiconductor layer, such as a Si layer. Alternatively, each fin 204 may include a multi-layer stack (ML) of alternating, different semiconductor layers over the substrate 202, where one of the semiconductor layers is considered a channel layer (e.g., such as channel layer 205 depicted in FIG. 17) and the other one is considered a non-channel layer. The non-channel layer is a sacrificial layer to be removed during a subsequent processing step, while the channel layer remains in the device 200 and engages with a subsequently-formed metal gate stack. The channel layers and the non-channel layers have different compositions. For example, the channel layer may include Si and the non-channel layer may include SiGe. In some examples, each ML may include a total of three to ten pairs of alternating semiconductor layers.

In some embodiments, forming the ML includes alternatingly growing the channel layers and the non-channel layers in a series of epitaxy processes. Each epitaxy process may include chemical vapor deposition (CVD) techniques (e.g., vapor-phase epitaxy (VPE), ultra-high vacuum CVD (UHV-CVD), low-pressure CVD (LP-CVD), and/or plasma-enhanced CVD (PE-CVD)), molecular beam epitaxy, other suitable selective epitaxial growth (SEG) processes, or combinations thereof. Each epitaxy process may use gaseous and/or liquid precursors, which interact with the composition of the underlying substrate. In some examples, the layers of the ML may be formed as nanosheets, nanowires, or nanorods.

The isolation features 208 may include silicon oxide (SiO and/or $SiO_2$), borophosphosilicate glass (BPSG), fluoride-doped silicate glass (FSG), phosphosilicate glass (PSG), boron-doped silicate glass (BSG), a low-k (having a dielectric constant less than that of silicon oxide, which is about 3.9) dielectric material, other suitable materials, or combinations thereof. Other isolation structure such as field oxide, local oxidation of silicon (LOCOS), and/or other suitable structures may also be implemented as the isolation features 208. In some examples, the isolation features 208 may include a multi-layer structure, for example, having one or more thermal oxide liner layers. In the present embodiments, forming the isolation features 208 includes depositing a dielectric material over the substrate 202, thereby filling the trenches separating the fins 204, applying one or more chemical mechanical planarization (CMP) process to planarize the device 200, and subsequently etching back portions of the dielectric material to form the isolation features 208, such that the top surface of the isolation features 208 is below a top surface of the fins 204. The dielectric material may be deposited by any suitable method, such as CVD, flowable CVD (FCVD), spin-on-glass (SOG), other suitable methods, or combinations thereof. A curing process may be applied after the depositing and planarizing the isolation material.

Still referring to FIGS. 2 and 3, the dummy gate stacks 210a and 210b may each include a polysilicon layer disposed over an optional dielectric layer and an interfacial layer (not depicted), and at least portions of each dummy gate stacks 210a and 210b are subsequently replaced with a high-k (a dielectric material having a dielectric constant greater than that of silicon dioxide, which is about 3.9) metal gate stack (HKMG) after forming other components of the device 200. The dummy gate stacks 210a and 210b may be formed by a series of deposition and patterning processes. For example, the dummy gate stacks 210a and 210b may be formed by depositing a polysilicon layer over the fins 204 and performing an anisotropic etching process (e.g., a dry etching process) to remove portions of the polysilicon. For embodiments in which an interfacial layer is included, the interfacial layer may include an oxide material, such as SiO and/or $SiO_2$, and may be formed by thermal oxidation, chemical oxidation, other suitable methods, or combinations thereof.

In the present embodiments, referring to FIG. 3, method 100 forms a hard mask layer (HM) 212 and an HM 214 over the dummy gate stacks 210a and 210b. In the present embodiments, the HMs 212 and 214 are configured to protect top portions of the dummy gate stacks 210a and 210b during subsequent fabrication processes. In the present embodiments, the HMs 212 and 214 each include silicon nitride (SiN), SiO and/or $SiO_2$, carbon-containing silicon nitride (SiCN), carbon-containing silicon oxide (SiOC), oxygen-containing silicon nitride (SiON), Si, carbon-and-oxygen-doped silicon nitride (SiOCN), a low-k dielectric material, other suitable materials, or combinations thereof, provided that the HMs 212 and 214 differ in composition. In one such example, the HM 212 may include silicon oxide and the HM 214 may include silicon nitride. The HMs 212 and 214 may be formed by any suitable method, such as CVD, atomic layer deposition (ALD), other suitable methods, or combinations thereof. As discussed below, the HMs 212 and 214 are later removed before removing the dummy gate stacks 210a and 210b to form their corresponding HKMGs.

Figure 4:
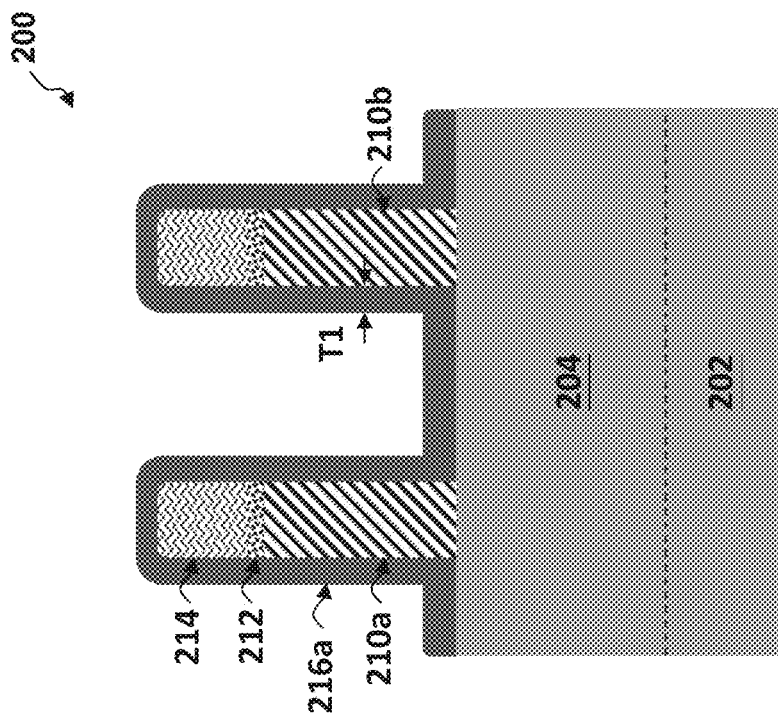

Now referring to FIG. 4, method 100 at operation 104 forms a first spacer layer 216a over the dummy gate stacks 210a and 210b. The first spacer layer 216a may include SiN, SiCN, SiOC, SiON, SiOCN, $SiO/SiO_2$, aluminum oxide ($Al_2O_3$), hafnium oxide ($HfO_2$), a low-k dielectric material, other suitable materials, or combinations thereof. In the present embodiments, the first spacer layer 216a is deposited as a blanket dielectric layer over the device 200 by any suitable method, such as CVD, ALD, physical vapor deposition (PVD), other suitable methods, or combinations thereof. In the present embodiments, the first spacers layer 216a constitutes a portion of a gate spacer 216, which may include additional spacer layer(s) (e.g., a second spacer layer 216b) as discussed in detail below.

Figures 5A, 5B:
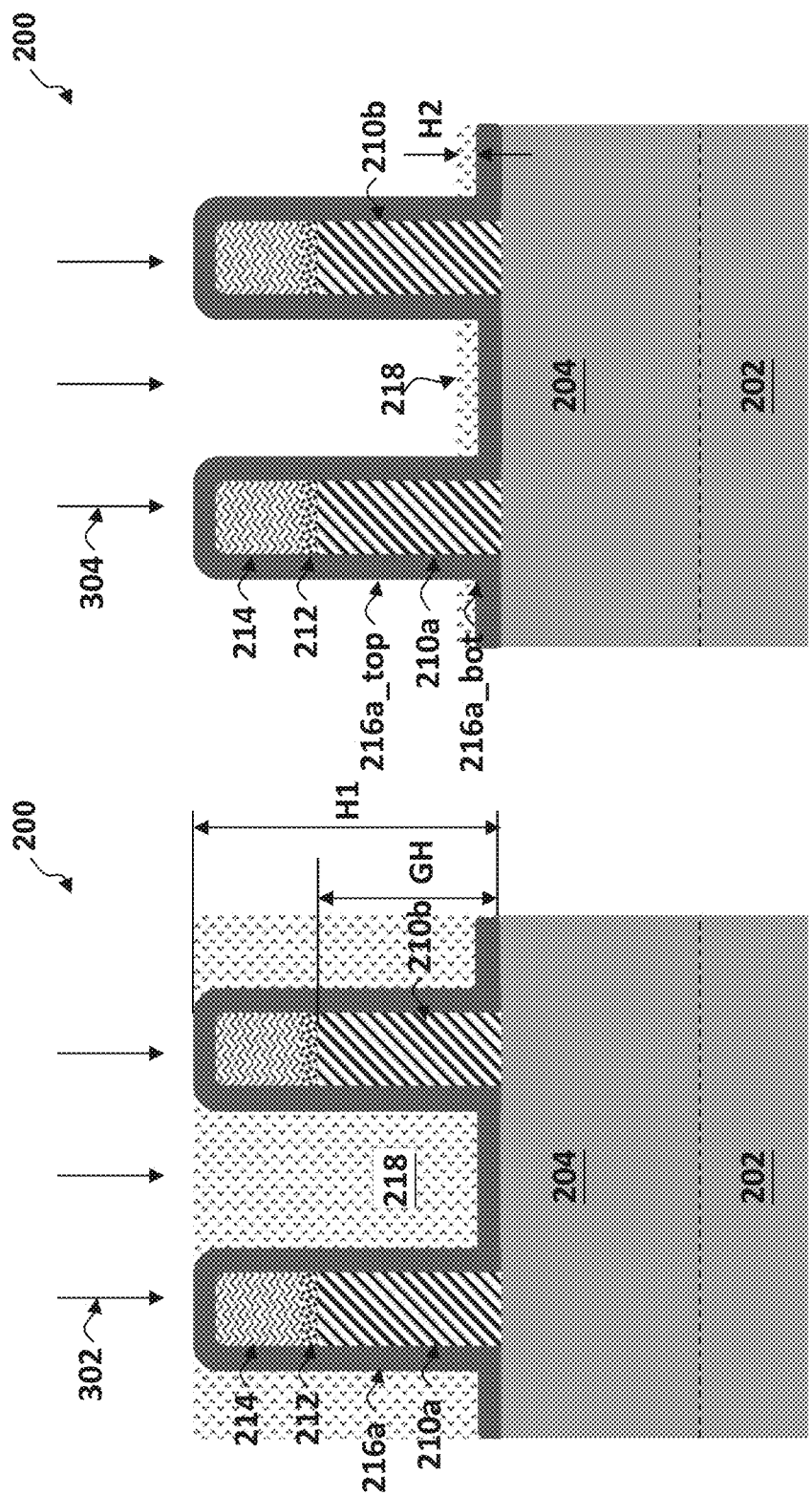
Figure 6:
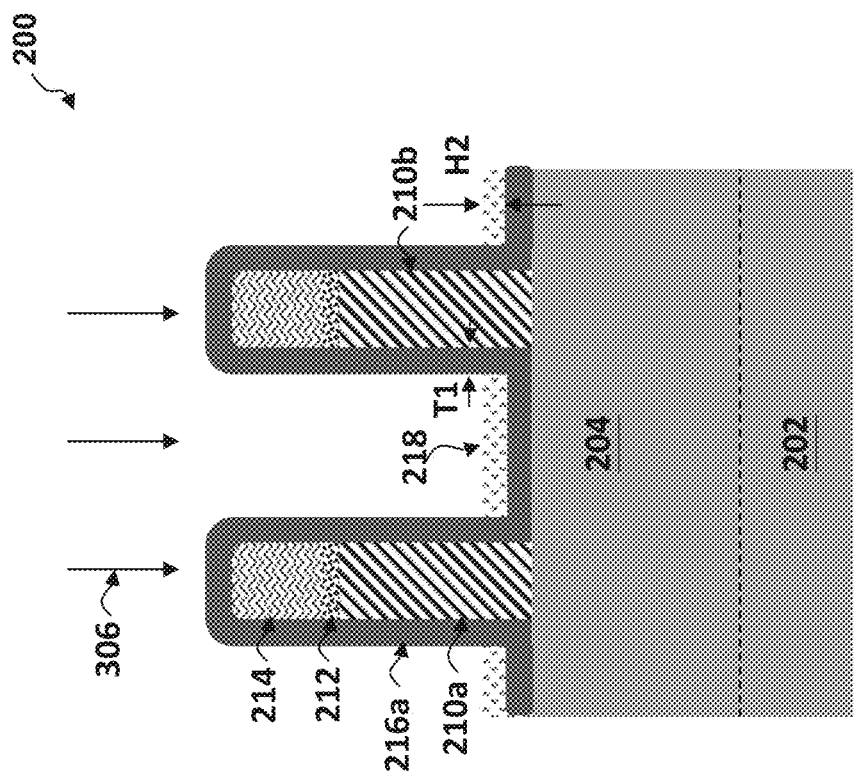

Thereafter, method 100 proceeds to selectively thinning portions of the first spacer layer 216 by forming a sacrificial layer 218 over bottom portions of the first spacer layer 216a, leaving top portions of the first spacer layer 216a exposed. In some embodiments, method 100 forms the sacrificial layer 218 by performing operations 106 and 107 as depicted in FIGS. 5A and 5B, respectively. In alternative embodiments, method 100 forms the sacrificial layer 218 by performing operation 108 as depicted in FIG. 6.

As IC device continue to advance, spacings between device features also decrease accordingly. Reduced spacings between adjacent gate spacers, which may additionally or alternatively be caused by increased spacer thickness for lowering device capacitance, may result in inadvertent consequences with respect to device performance. In one example, narrowed spacings between gate spacers may reduce the depth (under-etching) of an S/D recess formed in the fin 204 by limiting the amount of etchant provided during the etching process. In another example, narrowed spacings may inhibit the transfer of gaseous species when epitaxially growing an S/D feature, leading to prolonged entrapment of excess gaseous species between adjacent gate spacers and subsequent formation of amorphous semiconductor material at a position above the S/D feature. In yet another example, similar to the under-etching of the S/D recess, reduced spacings between gate spacers may prevent adequate etchant from penetrating between gate stacks, resulting in a contact opening that does not fully extend to expose the underlying S/D feature. The present embodiments provide methods of forming gate spacers whose thickness is adjusted along their height, such that separation distance between top portions of the gate spacers is enlarged relative to the bottom portions, and that the thickness of at least portions of the gate spacers remain satisfactory for purposes of reducing parasitic capacitance.

Referring to FIG. 5A, method 100 at operation 106 forms the sacrificial layer 218 over the device 200 in a deposition process 302, such that the sacrificial layer 218 completely fills the space between the dummy gate stacks 210a and 210b. In the present embodiments, the sacrificial layer 218 has a composition different from that of the first spacer layer 216a, such that it exhibits sufficient etching selectivity with respect to at least these components of the device 200. In some embodiments, the sacrificial layer 218 includes a polymeric material, such as one used for a bottom anti-reflective coating (BARC) in a multi-layer photoresist material. In some embodiments, the sacrificial layer includes an oxide, such as silicon oxide (SiO and/or $SiO_2$). Other suitable materials different from the first spacer layer 216a may also be applicable in the present embodiments. The sacrificial layer 218 may be formed by any suitable method, such as CVD, FCVD, SOG, other suitable methods, or combinations thereof. In some embodiments, a CMP process is performed to expose top portions of the first spacer layer 216a. In the present embodiments, the sacrificial layer 218 is formed to a thickness H1 greater than a gate height GH, which defines a height of the dummy gate stacks 210 and 210b.

Subsequently, referring to FIG. 5B, method 100 at operation 107 recesses portions of the sacrificial layer 218 in an etching process 304, such that the remaining portions of the sacrificial layer 218 surround bottom portions 216a_bot of the first spacer layer 216a, leaving the top portions 216a_top exposed. In the present embodiments, the etching process 304 selectively removes the sacrificial layer 218 without removing, or substantially removing, portions of the first spacer layer 216a.

As depicted herein, the remaining portions of the sacrificial layer 218 are defined by a thickness H2 that is less than the thickness H1. In the present embodiments, the thickness H2 determines a height of the bottom portions 216a_bot of the first spacer layer 216a and may thus be adjusted based on various design requirements. To control the thickness H2, various etching parameters of the etching process 304 may be adjusted. For example, the duration of the etching process 304 may be adjusted. In some examples, the thickness H2 may be about 5 nm to about 50 nm.

Referring to FIG. 6, method 100 at operation 108 deposits the sacrificial layer 218 to cover the bottom portions 216a_bot of the first spacer layer 216a in a deposition process 306. In the present embodiments, the deposition process 306 differs from the deposition process 302 in that the deposition process 306 is controlled to directly form the sacrificial layer 218 to the thickness H2, which is less than the thickness H1. In some embodiments, the duration of the deposition process 306 is controlled to achieve the thickness H2. In this regard, the deposition process 306 may be implemented for a shorter duration than the deposition process 302.

Figures 7, 8:
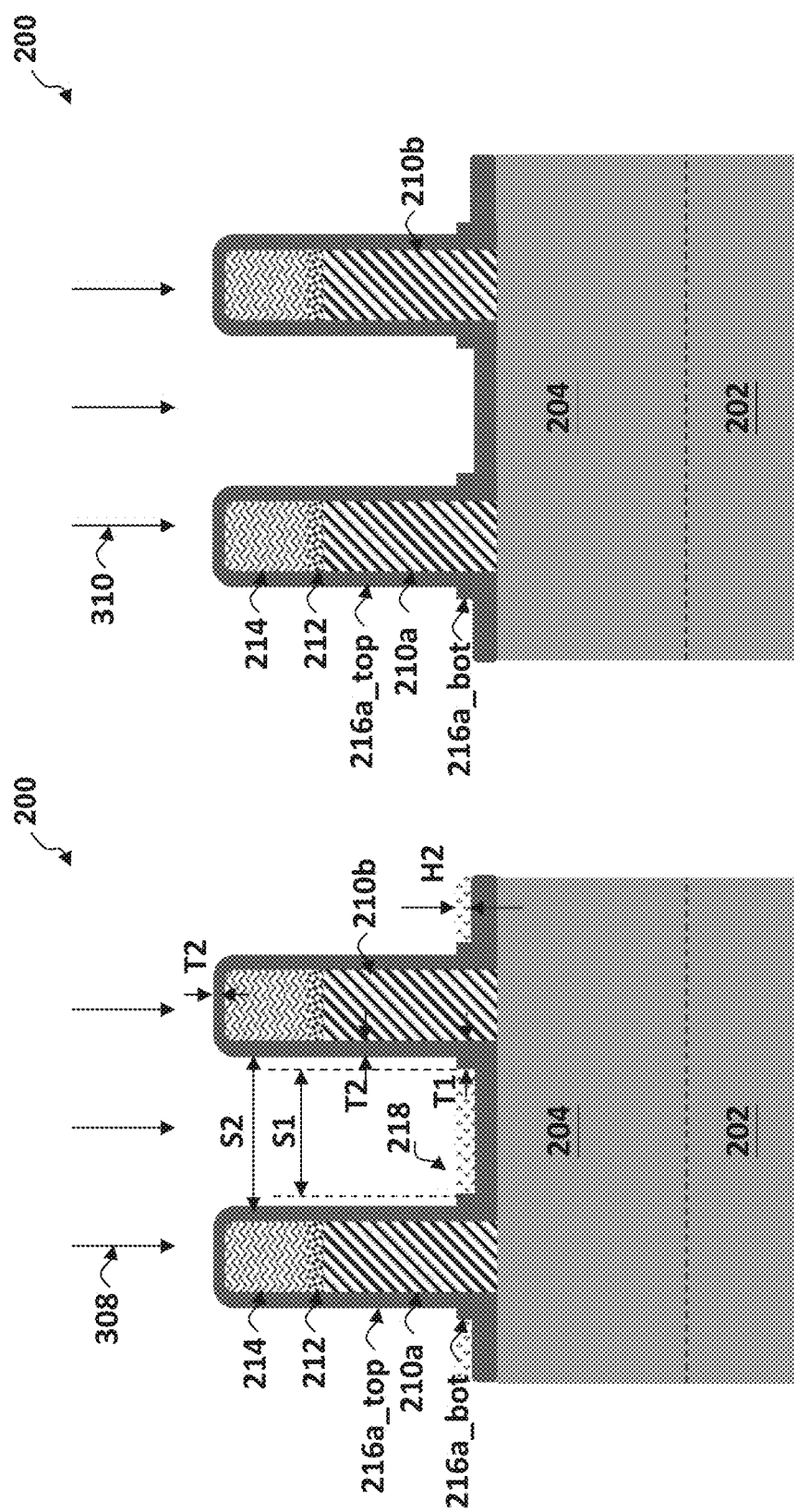

Now referring to FIG. 7, method 100 proceeds from either operation 107 or operation 108 to operation 110 to partially removing the exposed top portions 216a_top of the first spacer layer 216 in an etching process 308. In the present embodiments, the etching process 308 is configured to selectively etch the exposed top portions 216a_top of the first spacer layer 216 without etching, or substantially etching, the sacrificial layer 218 or the bottom portions 216a_bot of the first spacer layer 216 that are adjacent to the sacrificial layer 218. The etching process 308 may implement an etchant that is configured to remove the first spacer layer 216a at a significantly higher rate than the sacrificial layer 218. As such, the sacrificial layer 218 that fills the space between the bottom portions 216a_bot of the first spacer layer 216 prevents, or substantially prevents, the bottom portions 216a_bot from being etched by the etching process 308.

The choice of the etchant implemented during the etching process 308 may be determined based on the specific types of material contemplated for the first spacer layer 216 and the sacrificial layer 218. In some embodiments, the etching process 308 is a dry etching process, a wet etching process, an RIE process, other suitable etching process, or combinations thereof. In some embodiments, the etching process 308 etches the exposed top portions 216a_top of the first spacer layer 216 from all directions, such that the top portions 216a_top of the first spacer layer 216 have a uniform, or substantially uniform, thickness.

In the depicted embodiments, a thickness of the bottom portions 216a_bot of the first spacer layer is defined by T1 and a thickness of the etched top portions 216a_top of the first spacer layer is defined by T2, where the thickness T2 is less than the thickness T1 after performing the etching process 308. In other words, the bottom portions 216a_bot laterally protrude from the top portions 216a_top. Stated another way, a separation distance Si between the bottom portions 216a_bot is less than a separation distance S2 between the top portions 216a_top. In some embodiments, the duration of the etching process 308 is controlled to adjust the thickness T2.

In some embodiments, a ratio of T2 to T1 is about 0.2 to about 0.9. On one hand, if the ratio of T2 to T1 is less than about 0.2, the top portions 216a_top may be too thin to provide adequate insulation between the subsequently formed HKMG and an adjacent conductive feature (e.g., an S/D contact). On the other hand, if the ratio of T2 to T1 is greater than about 0.9, the separation distance S2 may not be sufficiently large to reduce shortcomings such as the under-etching of the S/D recesses, defects associated with forming the S/D features, and the under-etching of the contact openings as discussed above. In some examples, the thickness T2 may be about 0.5 nm to about 5 nm.

Referring to FIGS. 1B and 8, method 100 at operation 112 removes the sacrificial layer 218 from the device 200 in an etching process 310. In the present embodiments, the etching process 310 is configured to selectively remove the sacrificial layer 218 without removing, or substantially removing, the first spacer layer 216. As such, the etching process 310 implements an etchant that is different from that implemented during the etching process 308. The etching process 310 may be a wet etching process, a dry etching process, an RIE, other suitable etching processes, or combinations thereof. For embodiments in which the sacrificial layer 218 includes a polymer material, such as one used in a BARC, the etching process 310 may be a resist stripping process or a plasma ashing process.

Referring to FIGS. 9 and 10, method 100 at operation 114 forms a second spacer layer 216b over the etched first spacer layer 216a, resulting in the gate spacers 216. The second spacer layer 216b may include SiN, SiCN, SiOC, SiON, SiOCN, $Al_2O_3$, $HfO_2$, a low-k dielectric material, other suitable materials, or combinations thereof. In the present embodiments, the second spacer layer 216b has a composition different from that of the first spacer layer 216a. For example, the first spacer layer 216a may include SiN and the second spacer layer 216b may include SiOC. In some embodiments, the first spacer layer 216a has a lower k value than the second spacer layer 216b. In the present embodiments, referring to FIG. 9, the second spacer layer 216b is deposited as a blanket layer over the device 200 by a suitable method, such as CVD, ALD, PVD, other suitable methods, or combinations thereof. Subsequently, referring to FIG. 10, method 100 anisotropically removes portions of the first spacer layer 216a and second spacer layer 216b deposited over top surfaces of the dummy gate stack 210a, the dummy gate stack 210b, an the fin 204, leaving behind portions over the first spacer layer 216a and second spacer layer 216b along the sidewalls of the dummy gate stacks 210a and 210b to form the gate spacers 216. In some embodiments, as depicted herein, the remaining portions of the second spacer layer 216b vertically extend the protruding bottom portions 216a_bot of the first spacer layer 216a, such that sidewalls of the gate spacer 216 become continuous. As will be discussed below, the second spacer layer 216b is a sacrificial spacer layer configured to be removed before forming the HKMGs in place of the dummy gate stacks 210a and 210b.

Figures 11, 12:
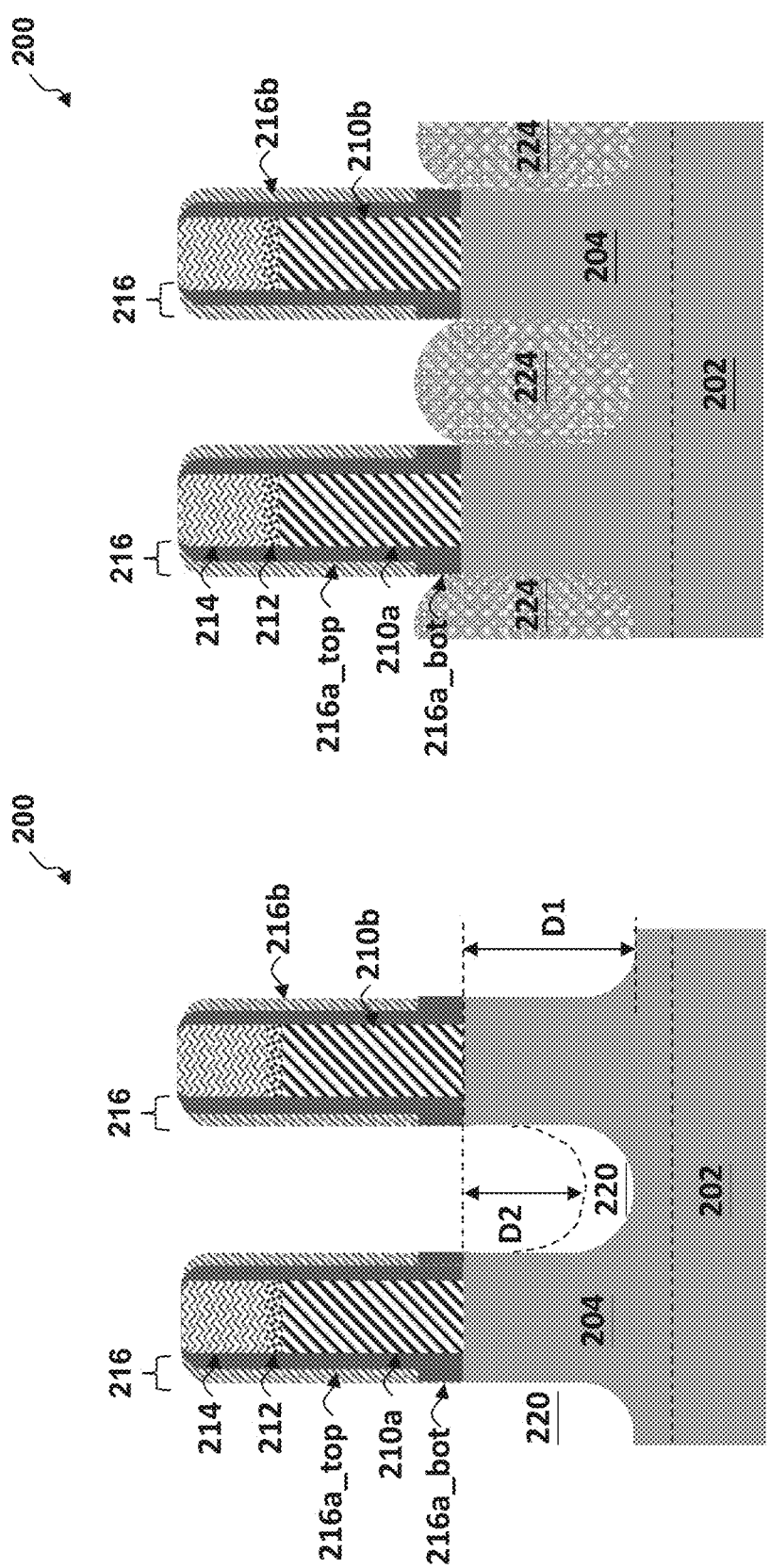

Referring to FIGS. 11 and 12, method 100 at operation 116 forms S/D features 224 adjacent to the gate spacers 216. Referring to FIG. 11, method 100 first forms S/D recesses 220 between adjacent gate spacers 216. The S/D recesses 220 may be formed by a dry etching process, a wet etching process, RIE, other suitable etching processes, or combinations thereof. Various parameters of the etching process including, for example, duration, temperature, pressure, source power, bias voltage, bias power, and/or etchant flow rate may be adjusted to control a depth D1 of the S/D recesses 220. A cleaning process may subsequently be performed to clean the S/D recesses 220 with a hydrofluoric acid (HF) solution or other suitable solution.

Because of the selective thinning of the first spacer layer 216 at operation 110, a top opening between adjacent gate spacers 216 has been widened, allowing the S/D recesses 220 to be formed to the depth D1. In comparison, without thinning the top portions 216a_top of the first spacer layer 216, the top opening between the adjacent gate spacers 216 would be narrower, which may limit the penetration of the etchant applied to form the S/D recesses 220 and result in an S/D recess (outlined by the dashed curve) with a depth D2 that is less than D1.

For embodiments in which the fin 204 includes the ML, before forming the epitaxial S/D features 224, method 100 first forms inner spacers 242 (see FIG. 17) on sidewalls of the non-channel layers (not depicted) exposed in the S/D recesses 220. The inner spacers 242 may include any suitable dielectric material SiN, SiO and/or $SiO_2$, SiCN, SiOC, SiON, SiOCN, a low-k dielectric material, other suitable dielectric material, or combination thereof. The inner spacers 242 may each be configured as a single-layer structure or a multi-layer structure including a combination of the dielectric materials provided herein. In some embodiments, the inner spacers 242 have a different composition from that of the gate spacers 216. The inner spacers 242 may be formed in a series of etching and deposition processes. For example, forming the inner spacers 242 may begin with selectively removing portions of the non-channel layers with respect to the channel layers 205 to form trenches (not depicted) by a suitable etching process, such as a dry etching process. Subsequently, one or more dielectric layers are formed in the trenches, followed by one or more etching processes to remove (i.e., etch back) excess dielectric layer(s) deposited on exposed surfaces of the channel layers 205, thereby forming the inner spacers 242. The one or more dielectric layers may be deposited by any suitable method, such as ALD, CVD, PVD, other suitable methods, or combinations thereof.

Referring to FIG. 12, method 100 then forms epitaxial S/D features 224 in the S/D recesses 220. Each of the epitaxial S/D features 224 may be suitable for forming a p-type FET device (e.g., including a p-type epitaxial material) or alternatively, an n-type FET device (e.g., including an n-type epitaxial material). The p-type epitaxial material may include one or more epitaxial layers of silicon germanium (epi SiGe) doped with a p-type dopant such as boron, germanium, indium, and/or other p-type dopants. The n-type epitaxial material may include one or more epitaxial layers of silicon (epi Si) or silicon carbon (epi SiC) doped with an n-type dopant such as arsenic, phosphorus, and/or other n-type dopants. In some embodiments, one or more epitaxy growth processes are performed to grow an epitaxial material in each S/D recess 220. For example, an epitaxy growth process similar to that discussed above with respect to forming the ML may be implemented to form the epitaxial S/D features 224. In some embodiments, the epitaxial material is doped in-situ by adding a dopant to a source material during the epitaxial growth process. In some embodiments, the epitaxial material is doped by an ion implantation process after performing a deposition process. In some embodiments, an annealing process is subsequently performed to activate the dopants in the epitaxial S/D features 224. In the present embodiments, the enlarged separation distance S2 between the top portions of the gate spacers 216 reduces entrapment of excess gaseous species between the gate spacers 216, thereby preventing formation of structural defects in the device 200.

Referring to FIG. 13, method 100 at operation 118 selectively removes the second spacer layer 216b from the gate spacers 216 in an etching process 312. In the present embodiments, the etching process 312 removes the second spacer layer 216b without removing, or substantially removing the first spacer layer 216a. As such, the remaining portions of the gate spacers 216, which include the top portions 216a_top and the bottom portions 216a_bot of the first spacer layer 216a, are defined by a step sidewall, where the separation distance Si between bottom portions of the adjacent gate spacers 216 is less than the separation distance S2 between top portions of the adjacent gate spacers 216. In other words, the top portions 216a_top and the bottom portions 216a_bot form a step profile where the bottom portions 216a_bot extend away from the top portions 216a_top. In some embodiments, the etching process 312 is a wet etching process and may implement an etchant such as phosphoric acid ($H_3PO_4$).

Figure 15:
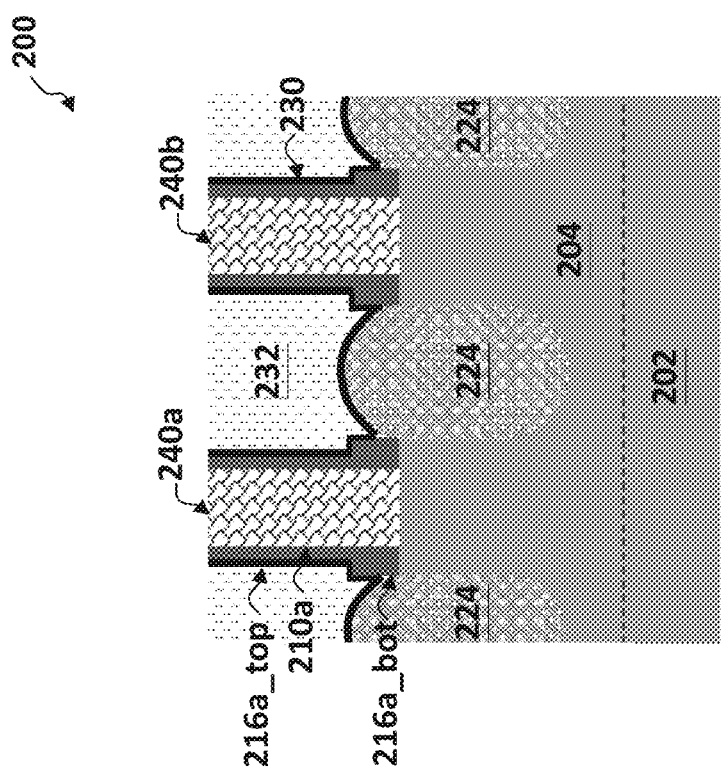

Referring to FIGS. 14 and 15, method 100 at operation 120 subsequently replaces the dummy gate stacks 210a and 210b with HKMGs 240a and 240b. Before replacing the dummy gate stacks 210a and 210b, referring to FIG. 14, method 100 forms an etch-stop layer (ESL) 230 over the S/D features 224 and an interlayer dielectric (ILD) layer 232 over the ESL 230. The ESL 230 may include SiN, SiCN, SiON, SiOCN, aluminum nitride (AlN), oxygen-doped aluminum nitride (AlON), other suitable materials, or combinations thereof, and may be formed by CVD, PVD, ALD, other suitable methods, or combinations thereof. The ILD layer 232 may include silicon oxide, a low-k dielectric material, TEOS, doped silicon oxide (e.g., BPSG, FSG, PSG, BSG, etc.), other suitable dielectric materials, or combinations thereof. The ILD layer 232 may be formed by CVD, FCVD, SOG, other suitable methods, or combinations thereof, and subsequently planarized in one or more CMP processes to expose a top surface of the dummy gate stacks 210a and 210b. In some embodiments, the one or more CMP processes remove the HMs 212 and 214 from the device 200. Thereafter, method 100 removes the dummy gate stacks 210a and 210b from the device 200 to form gate trenches (not depicted) between the gate spacers 216 by any suitable etching process, such as a dry etching process.

Figure 17:
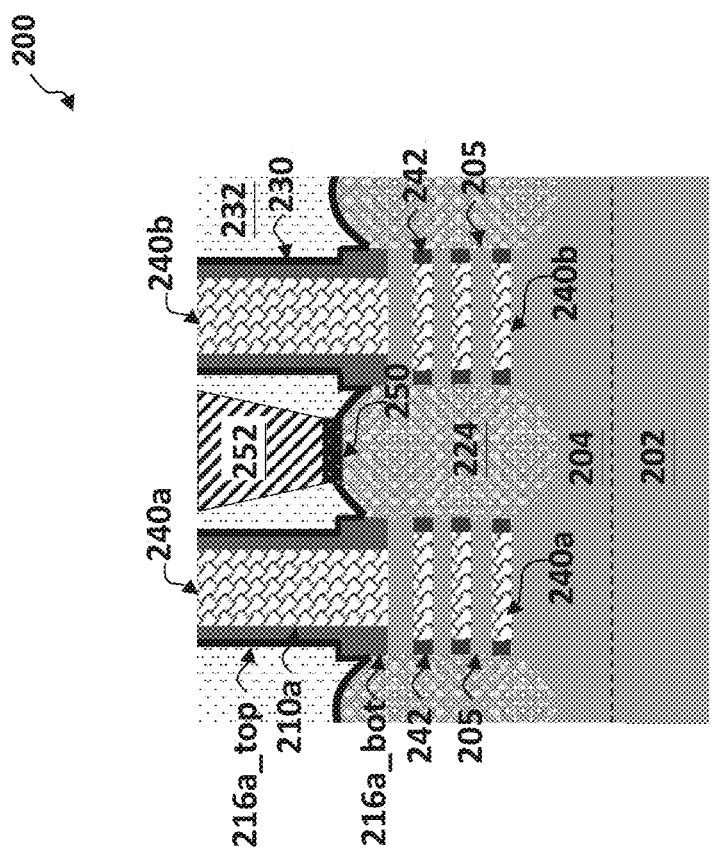

For embodiments in which the fin 204 includes the ML, method 100 at operation 120 removes the non-channel layers from the ML during a sheet (or wire) formation process, thereby forming openings (not depicted) between the channel layers 205 (see FIG. 17). In the present embodiments, the sheet formation process selectively removes the non-channel layers without removing, or substantially removing, the channel layers 205. The sheet formation process 312 may be implemented by any suitable etching process, such as a dry etching process, a wet etching process, an RIE process, or combinations thereof.

Subsequently, referring to FIG. 15, method 100 forms the HKMGs 240a and 240b in the gate trenches (and the openings between the channel layers 205, if applicable), such that the HKMGs are each interposed between the epitaxial S/D features 224. Although not depicted separately, the HKMGs 240a and 240b may each include an interfacial layer, a high-k dielectric layer disposed over the interfacial layer, and a metal gate electrode disposed over the high-k dielectric layer. The interfacial layer may include an oxide material, such as SiO and/or $SiO_2$, and the high-k dielectric layer may include any suitable dielectric material, such as $HfO_2$, lanthanum oxide ($La_2O_3$), other suitable materials, or combinations thereof. The metal gate electrode may include at least one work function metal layer and a bulk conductive layer disposed thereover. The work function metal layer may be a p-type or an n-type work function metal layer. Example work function materials include TiN, TaN, WN, $ZrSi_2$, $MoSi_2$, $TaSi_2$, $NiSi_2$, TaAl, TaAlC, TiAlN, TaC, TaCN, TaSiN, other suitable work function materials, or combinations thereof. The bulk conductive layer may include Co, W, Ru, Cu, Al, Ti, Ni, Au, Pt, Pd, other suitable materials, or combinations thereof. The HKMGs 240a and 240b may each further include other layers (not depicted separately), such as a capping layer, a barrier layer, other suitable layers, or combinations thereof. Various layers of the HKMGs 240a and 240b may be deposited by any suitable method, such as chemical oxidation, thermal oxidation, ALD, CVD, PVD, plating, other suitable methods, or combinations thereof.

Figure 16:
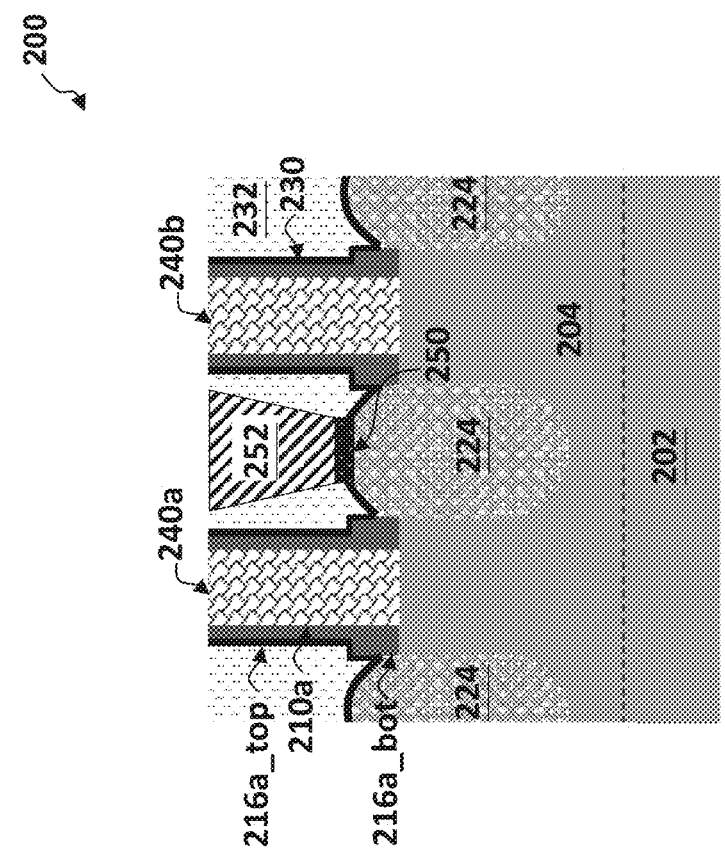

Referring to FIGS. 16 and 17, method 100 at operation 122 forms a S/D contact 252 over the S/D feature 224. The S/D contact 252 may include any suitable conductive material, such as Co, W, Ru, Cu, Al, Ti, Ni, Au, Pt, Pd, other suitable conductive materials, or combinations thereof. Forming the S/D contact 252 may include forming an S/D contact opening (or trench; not depicted) in the ILD layer 232 via a series of patterning and etching processes, and subsequently depositing a conductive material in the S/D contact opening using any suitable method, such as CVD, ALD, PVD, plating, other suitable processes, or combinations thereof. In some embodiments, a silicide layer 250 is formed between the epitaxial S/D feature 224 and the S/D contact 252. The silicide layer may include nickel silicide, cobalt silicide, tungsten silicide, tantalum silicide, titanium silicide, platinum silicide, erbium silicide, palladium silicide, other suitable silicide, or combinations thereof. Forming the silicide layer 250 may include depositing a metal layer over the S/D feature 224, allowing the metal layer to react with the underlying S/D feature 224 to form the silicide layer 250, and performing an etching process to remove any unreacted metal layer over the silicide layer 250. In the present embodiments, the enlarged separation distance S2 between the top portions of the gate spacers 216 allows more etchant to penetrate the ILD layer 232, thereby ensuring that the contact opening exposes the underlying S/D feature 224. FIG. 17 illustrates an embodiment in which the fin 204 includes the ML, where the HKMGs 240a and 240b engage with the channel layers 205 to form a nano sheet (or GAA) FET.

Subsequently, method 100 at operation 124 may form additional features over the device 200 such as, for example, a gate contact (not depicted) in the ILD layer to contact the HKMGs 240a and/or 240b, vertical interconnect features (e.g., vias; not depicted), horizontal interconnect features (e.g., conductive lines; not depicted), additional intermetal dielectric layers (e.g., ESLs and ILD layers; not depicted), other suitable features, or combinations thereof.

The present disclosure provides a semiconductor structure that includes a gate spacer disposed along a sidewall of a metal gate stack, where a thickness of a top portion of the gate spacer is less than a thickness of a bottom portion of the gate spacer. In the present embodiments, a sacrificial layer is implemented to mask the bottom portion of the gate spacer, while the exposed top portion of the gate spacer is selectively etched. By thinning the top portion of the gate spacer, an opening between adjacent gate spacer is widened. Although not intended to be limiting, one or more embodiments of the present disclosure provide many benefits. For example, widened spacing allows more adequate penetration of etchants to ensure sufficient etching of S/D recesses and/or S/D contact openings. Additionally, widened spacing between the gate spacers reduces formation of structural defects when forming epitaxial S/D features. Embodiments of the disclosed methods can be readily integrated into existing processes and technologies for manufacturing FETs.

In one aspect, the present disclosure provides a method of forming a semiconductor structure that includes forming a dummy gate stack over a semiconductor layer, forming a spacer layer over the dummy gate stack, and treating the spacer layer, such that a bottom portion of the spacer layer has a greater thickness than a top portion of the spacer layer. The method further includes etching portions of the treated spacer layer, such that remaining portions of the treated spacer layer are disposed along sidewalls of the dummy gate stack and subsequently forming a source/drain feature in the semiconductor layer adjacent to the remaining portions of the treated spacer layer.

In another aspect, the present disclosure provides a method of forming a semiconductor structure that includes forming a semiconductor fin over a substrate, forming a dummy gate stack over the semiconductor fin, depositing a dielectric layer over the dummy gate stack, and selectively etching the dielectric layer, such that a top portion and a bottom portion of the dielectric layer form a step profile. The method further includes removing portions of the dielectric layer to form a gate spacer and subsequently forming a source/drain feature in the semiconductor fin adjacent to the gate spacer.

In yet another aspect, the present disclosure provides a method of forming a semiconductor structure that includes forming a semiconductor structure that includes a dummy gate stack disposed over a fin that protrudes from a substrate, forming a gate spacer layer over the dummy gate stack, and processing the gate spacer layer to form a step profile, where a bottom portion of the gate spacer layer extends from a top portion of the gate spacer layer. The method further includes etching the processed gate spacer layer to form a gate spacer along a sidewall of the dummy gate stack. The method further includes forming a source/drain feature in the fin adjacent to the gate spacer and subsequently replacing the dummy gate stack with a metal gate stack.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dummy gate stack over a semiconductor layer;
   forming a spacer layer over the semiconductor layer, wherein the spacer layer comprising a vertical part extending along an upper portion of the dummy gate stack and a horizontal part in direct contact with both the semiconductor layer and a lower portion of the dummy gate stack;
   treating the spacer layer to form a step sidewall for the vertical part of the spacer layer, wherein a bottom portion of the vertical part of the spacer layer has a greater thickness than a top portion of the vertical part of the spacer layer;
   etching portions of the treated spacer layer, such that remaining portions of the treated spacer layer are disposed along sidewalls of the dummy gate stack; and
   forming a source/drain (S/D) feature in the semiconductor layer adjacent to the remaining portions of the treated spacer layer.

2. The method of claim 1, wherein the spacer layer is a first spacer layer, the method further comprising forming a second spacer layer over the first spacer layer after treating the first spacer layer, wherein etching the portions of the treated first spacer layer also etches portions of the second spacer layer, such that remaining portions of the second spacer layer are disposed along sidewalls of the dummy gate stack.

3. The method of claim 2, further comprising removing the etched second spacer layer after forming the S/D feature.

4. The method of claim 1, further comprising:
forming an interlayer-dielectric (ILD) layer over the treated spacer layer;
replacing the dummy gate stack with a metal gate stack in the ILD layer; and
forming an S/D contact in the ILD layer over the S/D feature.

5. The method of claim 1, wherein treating the spacer layer includes depositing a sacrificial layer to cover the bottom portion of the vertical part of the spacer layer without covering the top portion of the vertical part of the spacer layer, and wherein the sacrificial layer includes a polymer material.

6. The method of claim 1, wherein treating the spacer layer includes:
depositing a sacrificial layer over the spacer layer;
recessing the sacrificial layer such that a remaining portion of the sacrificial layer is in direct contact with the bottom portion of the vertical part of the spacer layer and the top portion of the vertical part of the spacer layer is exposed;
thinning the exposed top portion of the vertical part of the spacer layer; and
selectively removing the remaining portion of the sacrificial layer to expose the bottom portion of the vertical part of the spacer layer.

7. The method of claim 1, wherein treating the spacer layer includes:
depositing a sacrificial layer over the spacer layer, wherein the sacrificial layer is in contact with the bottom portion of the vertical part of the spacer layer, and wherein the top portion of the vertical part of the spacer layer is exposed;
thinning the exposed top portion of the vertical part of the spacer layer; and
selectively removing the sacrificial layer to expose the bottom portion of the vertical part of the spacer layer.

8. A method, comprising:
forming a semiconductor fin over a substrate;
forming a dummy gate stack over the semiconductor fin;
depositing a dielectric layer over the dummy gate stack;
selectively etching the dielectric layer, such that a top portion and a bottom portion of the dielectric layer form a step profile;
after the selectively etching of the dielectric layer, removing portions of the dielectric layer to form a gate spacer; and
forming a source/drain (S/D) feature in the semiconductor fin adjacent to the gate spacer.

9. The method of claim 8, wherein the dielectric layer is a first dielectric layer, the method further comprising:
depositing a second dielectric layer over the first dielectric layer after selectively etching the first dielectric layer, wherein removing portions of the first dielectric layer also removes portions of the second dielectric layer, such that a sidewall of the gate spacer includes the first dielectric layer and the second dielectric layer; and
selectively removing the second dielectric layer with respect to the first dielectric layer after forming the S/D feature.

10. The method of claim 9, wherein the first dielectric layer and the second dielectric layer have different compositions.

11. The method of claim 8, wherein selectively etching the dielectric layer includes:
depositing a sacrificial layer over the dielectric layer;
recessing the sacrificial layer such that a remaining portion of the sacrificial layer is disposed over the bottom portion of the dielectric layer, thereby exposing the top portion;
thinning the exposed top portion of the dielectric layer to form the step profile; and
selectively removing the remaining portion of the sacrificial layer to expose the step profile.

12. The method of claim 8, wherein selectively etching the dielectric layer includes:
depositing a sacrificial layer over the dielectric layer, wherein the sacrificial layer is in contact with the bottom portion of the dielectric layer to expose the top portion;
thinning the exposed top portion of the dielectric layer to from the step profile; and
selectively removing the remaining portion of the sacrificial layer to expose the step profile.

13. The method of claim 8, wherein the top portion of the dielectric layer has a first thickness and the bottom portion of the dielectric layer has a second thickness, and wherein a ratio of the first thickness to the second thickness is about 0.2 to about 0.9.

14. The method of claim 8, further comprising:
replacing the dummy gate stack with a metal gate stack; and
forming a S/D contact over the S/D feature and adjacent to the metal gate stack.

15. A method, comprising:
forming a semiconductor structure that includes a dummy gate stack disposed over a fin that protrudes from a substrate;
forming a first gate spacer layer over the dummy gate stack;
forming a second gate spacer layer over the first gate spacer layer;
etching the first gate spacer layer and the second gate spacer layer to form a gate spacer along a sidewall of the dummy gate stack, the gate spacer comprising the etched first gate spacer layer and the etched second gate spacer layer;
forming a source/drain (S/D) feature in the fin adjacent to the gate spacer;
after the forming of the source/drain (S/D) feature, selectively removing the etched second gate spacer layer; and
after the selectively removing of the etched second gate spacer layer, replacing the dummy gate stack with a metal gate stack.

16. The method of claim 15, further comprising:
processing the first gate spacer layer to form a step profile, wherein a bottom portion of the first gate spacer layer extends from a top portion of the first gate spacer layer, wherein the bottom portion of the first gate spacer layer is defined by a first thickness and the top portion of the first gate spacer layer is defined by a second thickness, and wherein a ratio of the second thickness to the first thickness is about 0.2 to about 0.9.

17. The method of claim 15, wherein forming the fin includes forming a stack of semiconductor layers over the substrate and patterning the stack of semiconductor layers to form the fin.

18. The method of claim 17, wherein replacing the dummy gate stack results in bottom portions of the metal gate stack to interleave with the stack of semiconductor layers.

19. The method of claim 15, further comprising:
depositing a sacrificial layer over the first gate spacer layer;
recessing the sacrificial layer such that a remaining portion of the sacrificial layer is disposed over a bottom portion of the first gate spacer layer, thereby exposing a top portion of the first gate spacer layer;
etching the exposed top portion of the first gate spacer layer to form a step profile; and
selectively removing the remaining portion of the sacrificial layer to expose the step profile.

20. The method of claim 15, further comprising:
depositing a sacrificial layer over the first gate spacer layer, wherein the sacrificial layer is in contact with a bottom portion of the first gate spacer layer to expose a top portion of the first gate spacer layer;
etching the exposed top portion of the first gate spacer layer to from a step profile; and
selectively removing the remaining portion of the sacrificial layer to expose the step profile.

* * * * *